(12) United States Patent
Kingsborough

(10) Patent No.: US 7,232,750 B1
(45) Date of Patent: Jun. 19, 2007

(54) METHODS INVOLVING SPIN-ON POLYMERS THAT REVERSIBLY BIND CHARGE CARRIERS

(75) Inventor: Richard P. Kingsborough, North Chelmsford, MA (US)

(73) Assignee: Spansion LLC, Sunnyvale, CA (US)

( * ) Notice: Subject to any disclaimer, the term of this patent is extended or adjusted under 35 U.S.C. 154(b) by 172 days.

(21) Appl. No.: 11/034,154

(22) Filed: Jan. 12, 2005

(51) Int. Cl.
*H01L 21/4763* (2006.01)

(52) U.S. Cl. .................. 438/623; 438/99; 438/725; 438/790

(58) Field of Classification Search .............. 438/62, 438/99, 562, 623, 725, 780
See application file for complete search history.

(56) References Cited

U.S. PATENT DOCUMENTS

| | | | |
|---|---|---|---|
| 5,670,791 A * | 9/1997 | Halls et al. ............ | 257/40 |
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B2 | 7/2004 | Krieger et al. | |
| 6,770,905 B1 | 8/2004 | Buynoski et al. | |
| 6,773,954 B1 | 8/2004 | Subramanian et al. | |
| 6,781,868 B2 | 8/2004 | Bulovic et al. | |
| 6,787,458 B1 | 9/2004 | Tripsas et al. | |
| 6,803,267 B1 | 10/2004 | Subramanian et al. | |
| 6,825,060 B1 | 11/2004 | Lyons et al. | |
| 7,067,349 B1 * | 6/2006 | Buynoski et al. ............ | 438/99 |

* cited by examiner

*Primary Examiner*—Dung A. Le
(74) *Attorney, Agent, or Firm*—Amin, Turocy & Calvin, LLP

(57) ABSTRACT

Methods for improving memory retention properties of a polymer memory cell are disclosed. The methods include forming a first electrode, depositing a passive layer over the first electrode, forming a semiconducting polymer layer containing at least one semiconducting polymer with at least one charge carrier-binding group over the passive layer, and forming a second electrode. The charge carrier-binding groups can be incorporated into semiconducting polymers either as side groups or into the main chain of semiconducting polymers.

20 Claims, 8 Drawing Sheets

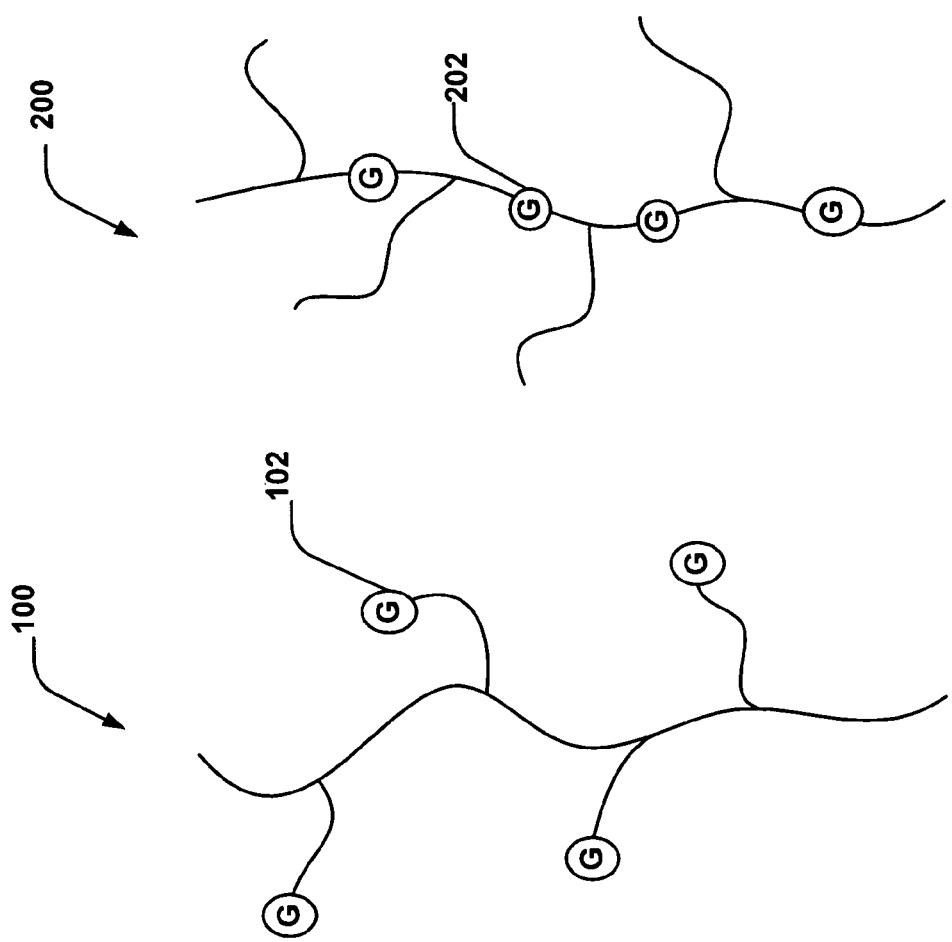

METHODS INVOLVING SPIN-ON POLYMERS THAT REVERSIBLY BIND CHARGE CARRIERS

TECHNICAL FIELD

The subject invention generally relates to memory cells. More particularly, the subject invention relates to methods for improving memory retention properties of polymer memory cells.

BACKGROUND ART

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can be typically employed in various types of storage devices. Storage devices include long term storage mediums such as, for example, hard disk drives, compact disk drives and corresponding media, digital video disk (DVD) drives, and the like. Long term storage mediums typically store larger amounts of information at a lower cost, but are slower than other types of storage devices. Storage devices also include memory devices which are often, but not always, short term storage mediums.

Memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Examples of non-volatile memory cells include; ROM, programmable read only memory (PROM), erasable programmable read only memory (EPROM), electrically erasable programmable read only memory (EEPROM), flash EEPROM, and the like. Volatile memory cells generally provide faster operation at a lower cost as compared to non-volatile memory cells. Nonetheless, to retain the information, the stored data typically must be refreshed; that is, each capacitor must be periodically charged or discharged to maintain the capacitor's charged or discharged state. The maximum time allowable between refresh operations depends on the charge storage capabilities of the capacitors that make up the memory cells in the array. The memory device manufacturer typically specifies a refresh time that guarantees data retention in the memory cells.

Each memory cell in a memory device can be accessed or "read", "written", and "erased" with information. Memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices.

Because of the increasing demand for information storage, memory device developers and manufacturers are constantly attempting to increase speed, storage, retention, and retrieval for memory devices (e.g., increase write/read speed). At the same time, to reach high storage densities, manufacturers typically focus on scaling down semiconductor device dimensions (e.g., at sub-micron levels).

Therefore, a need exists in the art for systems and methods that provide for improved memory storage, retention, and retrieval.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides methods for improving memory retention properties of polymer memory cells. More specifically, the semiconducting polymer layer of a polymer memory cell is provided with at least one semiconducting polymer that can reversibly bind charge carriers. The subject invention, by providing for temporary immobilization of charge carriers in an "on" state facilitates the extension of retention time of a polymer memory cell/device.

One aspect of the subject invention relates to methods that can improve memory retention time of a polymer memory cell/device. The methods include incorporation of at least one semiconducting polymer with one or more charge carrier-binding groups into a semiconducting polymer layer of a polymer memory cell/device. In one embodiment, one or more semiconducting polymers with one or more side groups that can reversibly bind charge carriers can be incorporated into the semiconducting polymer layer. In another embodiment, the semiconducting polymer layer can include one or more semiconducting polymers containing charge carrier-binding groups in their main chain/backbone. Temporary immobilization of charge carriers resulting from reversible binding of charge carriers facilitates extension of duration of memory retention of a polymer memory cell in a reliable and efficient manner.

Another aspect of the subject invention relates to providing a polymer memory device containing at least one polymer memory cell made of two electrodes, one or more passive layers, and a semiconducting polymer layer between two electrodes, the semiconducting polymer layer containing one or more semiconducting polymers with one or more charge carrier-binding groups.

In yet another aspect of the subject invention, methods are provided for improving the retention time of charge carriers injected into a semiconducting polymer layer of an organic thin film transistor. The methods involve forming a gate electrode; forming an insulator layer; forming source and drain regions; and forming a semiconducting polymer layer contacting the source and the drain regions, by for example, spin on techniques, wherein the semiconducting polymer layer contains at least one semiconducting polymer with one or more charge carrier-binding groups.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 1 is a schematic representation of a semiconducting polymer with charge carrier-binding groups according to one aspect of the subject invention.

FIG. 2 is a schematic representation of a semiconducting polymer with charge carrier-binding groups according to one aspect of the subject invention.

DISCLOSURE OF THE INVENTION

Figure 3:
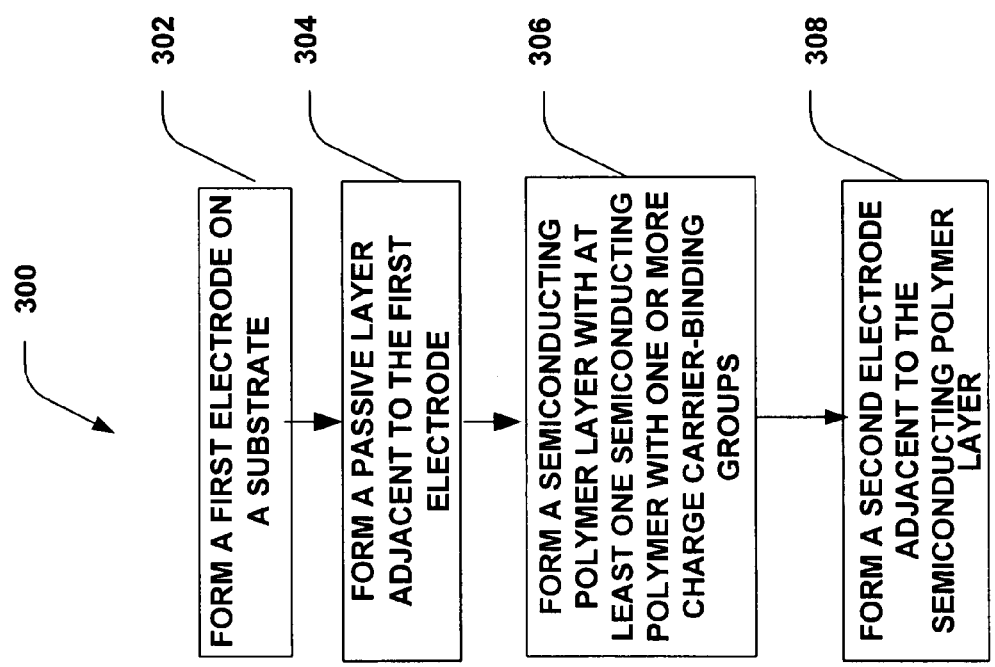
FIG. 3 illustrates a flow diagram of an exemplary methodology for fabricating a polymer memory cell according to one aspect of the subject invention.

The subject invention provides methods for improving/increasing memory retention of a polymer memory cell. The methods utilize temporary and reversible immobilization of charge carriers (e.g., metal ions) injected into the semiconducting polymer layer of a polymer memory cell from a passive layer or one of the electrodes. The methods involve forming a semiconducting polymer layer with one or more semiconducting polymers containing one or more charge carrier-binding groups. Examples of charge carrier-binding groups that can be used to reversibly bind charge carriers include substituted or unsubstitued pyridines, bipyridines, ethers, thioethers, crown ethers, alkylene glycols, and derivatives thereof.

The subject invention may be understood and its advantages appreciated in conjunction with figures and drawings, wherein like numerals represent like features throughout. It is understood that the description of these embodiments are merely illustrative and they should not be taken in a limiting sense. The embodiments of an apparatus or method of the subject invention described herein can be manufactured in a number of different positions and orientations.

The term "charge carrier" in the context of the subject invention refers to ions, electrons, holes, and the like. The term "charge carrier-binding group" refers to any chemical moiety/group that can reversibly bind, complex, and/or accept ions/charges. In the context of the subject invention, the "charge carrier-binding group" can be present either as side groups or as part of the main chain/backbone of a semiconducting polymer. The terms passive layer, superionic layer, and conductivity facilitating layer can be used interchangeably and have the same meaning.

In polymer memory cells, the conductance/resistance of a semiconducting polymer in response to an electric field represents memory. The memory retention properties of a polymer memory cell depend on a variety of factors, such as stability of charge carriers injected into the semiconducting polymer layer both when the memory cell is exposed to an electric field and also when the memory cell is shut down. In cases where the passive layer (superionic layer) or electrodes of a polymer memory contain metals or compounds containing metals, the metal ions constitute charge carriers. These metal ions contribute to the conductivity of the semiconducting polymer layer. For example, in cases where copper or copper containing compounds form electrodes or passive layers, copper ions constitute charge carriers and drive the memory cell function.

The retention time of a memory cell can be substantially improved or increased by temporary immobilization of charge carriers (e.g., copper ions, electrons, holes, and the like) in the "on" state. Although not wishing to be bound by any theory, the subject invention, by providing a semiconducting polymer layer with one or more semiconducting polymers with groups that can reversibly bind charge carriers, substantially increases the duration the carrier ions can stay inside the semiconducting polymer layer, and thereby improves the memory retention time of a memory cell/device.

The semiconducting polymer with charge carrier-binding groups of the subject invention can be any semiconducting polymer containing one or more groups that can reversibly bind, accept, and/or complex with charge carriers. The charge carrier binding groups of the subject invention can be formed either as side chain groups or as part of the main chain/backbone of a semiconducting polymer. FIG. 1 is a schematic illustration of a semiconducting polymer 100 according to one aspect of the invention showing charge carrier-binding groups (102) as side groups. FIG. 2 is a schematic illustration of a semiconducting polymer 200 according to one aspect of the invention showing charge carrier-binding groups (202) as part of main chain/backbone of a semiconducting polymer.

In one embodiment of the subject invention, the semiconducting polymer with charge carrier-binding groups is a semiconducting polymer containing one or more of heterocyclic side group moieties, oxygen-containing side group moieties, sulfur-containing side group moieties, and nitrogen-containing side group moieties. In another embodiment of the subject invention, the semiconducting polymer with charge carrier-binding groups is a semiconducting polymer containing one or more of substituted and/or unsubstituted pyridines, bipyridines, terpyridines, quaterpyridines, quinquepyridines, sexipyridines, phenanthrolines, ethers, thioethers, crown ethers, alkylene glycols, and derivatives thereof as side-chain groups. In yet another embodiment of the subject invention, the semiconducting polymer with charge carrier-binding groups is a semiconducting polymer containing in its main chain/backbone one or more of heterocyclic group moieties, oxygen-containing group moieties, sulfur-containing group moieties, and nitrogen-containing group moieties. In one more embodiment of the subject invention, the semiconducting polymer with charge carrier-binding groups is a semiconducting polymer containing in its main chain/backbone one or more of substituted and/or unsubstituted pyridines, bipyridines, terpyridines, quaterpyridines, quinquepyridines, sexipyridines, phenanthrolines, ethers, thioethers, crown ethers, alkylene glycols, and derivatives thereof.

The semiconducting polymer layer is formed by spin-on techniques (depositing a mixture of the semiconducting polymer with charge carrier-binding side groups and/or precursor(s) thereof and a solvent, then removing the solvent from the substrate/electrode). During formation, the semiconducting polymer with charge carrier-binding side groups self assembles between the electrodes. It is not typically necessary to functionalize one or more ends of the semiconducting polymer with charge carrier-binding side groups in order to attach it to an electrode/passive layer. When using spin-on techniques, the solvent in which the semiconducting polymer with charge carrier-binding side groups and/or precursor(s) thereof is charged before application to the wafer structure is able to solubilize the semiconducting polymer with charge carrier-binding side groups and/or precursor(s) thereof so that the semiconducting polymer layer is formed in a substantially uniform manner over the surface of the substrate.

Solvents useful for this purpose include one or more of glycol ether esters, glycol ethers, furans, aromatic hydrocarbons, and alkyl alcohols containing from about 4 to about 7 carbon atoms. Two or more of glycol ether esters, glycol ethers, furans, and alkyl alcohols containing from about 4 to about 7 carbon atoms may be employed as a solvent system. The solvent system may contain one or more of glycol ether esters, glycol ethers, furans, and alkyl alcohols, and another organic solvent.

Examples of glycol ether esters include ethylene glycol methyl ether acetate, ethylene glycol ethyl ether acetate, ethylene glycol propyl ether acetate, ethylene glycol butyl ether acetate, propylene glycol methyl ether acetate, propylene glycol ethyl ether acetate, propylene glycol propyl ether acetate, propylene glycol butyl ether acetate, and the like.

Glycol ether esters also include polyalkylene glycol ether esters such as poly(ethylene glycol) alkyl ether acetates and poly(propylene glycol) alkyl ether acetates. Examples of poly(ethylene glycol) alkyl ether acetates and poly(propylene glycol) alkyl ether acetates include poly(ethylene glycol) methyl ether acetate, poly(ethylene glycol) ethyl ether acetate, poly(ethylene glycol) propyl ether acetate, poly(ethylene glycol) butyl ether acetate, poly(propylene glycol) methyl ether acetate, poly(propylene glycol) ethyl ether acetate, poly(propylene glycol) propyl ether acetate, and poly(propylene glycol) butyl ether acetate.

Additional specific examples of polyalkylene glycol ether esters include di(ethylene glycol) methyl ether acetate, di(ethylene glycol) ethyl ether acetate, di(ethylene glycol) propyl ether acetate, di(ethylene glycol) butyl ether acetate, di(ethylene glycol) hexyl ether acetate, di(ethylene glycol) dodecyl ether aceate, di(propylene glycol) methyl ether acetate, di(propylene glycol) ethyl ether acetate, di(propylene glycol) butyl ether acetate, tri(ethylene glycol) methyl ether acetate, tri(ethylene glycol) ethyl ether acetate, tri(ethylene glycol) butyl ether acetate, tri(propylene glycol) methyl ether acetate, tri(propylene glycol) butyl ether acetate, and the like.

Examples of glycol ethers include alkylene glycol ethers and polyalkylene glycol ethers, such as poly(ethylene glycol) methyl ether, poly(ethylene glycol) ethyl ether, poly(ethylene glycol) propyl ether, poly(ethylene glycol) butyl ether, poly(propylene glycol) methyl ether, poly(propylene glycol) ethyl ether, poly(propylene glycol) propyl ether, and poly(propylene glycol) butyl ether. Other examples of glycol ethers include ethylene glycol methyl ether, ethylene glycol methylbutyl ether, ethylene glycol ethylbutyl ether, ethylene glycol ethyl ether, ethylene glycol butyl ether, ethylene glycol dimethyl ether, ethylene glycol diethyl ether, ethylene glycol dibutyl ether, propylene glycol methyl ether, propylene glycol ethyl ether, propylene glycol butyl ether, propylene glycol dimethyl ether, propylene glycol diethyl ether, propylene glycol dibutyl ether, di(ethylene glycol) methyl ether, di(ethylene glycol) ethyl ether, di(ethylene glycol) butyl ether, di(ethylene glycol) hexyl ether, di(ethylene glycol) dimethyl ether, di(ethylene glycol) diethyl ether, di(ethylene glycol) dibutyl ether, di(ethylene glycol) butylmethyl ether, di(ethylene glycol) dodecyl ether, di(propylene glycol) methyl ether, di(propylene glycol) butyl ether, tri(ethylene glycol) methyl ether, tri(ethylene glycol) dimethyl ether, tri(propylene glycol) methyl ether, and tri(propylene glycol) butyl ether.

Furans include tetrahydrofuran. Alkyl alcohols containing from about 4 to about 7 carbon atoms secifically include alkyl alcohols containing from about 5 to about 6 carbon atoms. Examples of alkyl alcohols containing from about 4 to about 7 carbon atoms include n-butanol, iso-butanol, n-pentanol, iso-pentanol, cyclopentanol, n-hexanol, cyclohexanol, heptanol, and the like.

Examples of aromatic hydrocarbons include unsubstituted and substituted benzenes, unsubstituted and substituted toluenes, xylenes, mesitylene, unsubstituted and substituted naphthalenes, and the like.

Using one or more of glycol ether esters, glycol ethers, furans, aromatic hydrocarbons, and alkyl alcohols containing from about 4 to about 7 carbon atoms, formation of the semiconducting polymer layer is facilitated. In particular, forming the semiconducting polymer with charge carrier-binding side groups in a direction away from the surface on which it is formed is facilitated, delivering the semiconducting polymer with charge carrier-binding side groups to the substrate surface is facilitated, uniformly spaced polymer backbones are formed on the surface, and/or the formation of the semiconducting polymer layer proceeds in a controllable manner.

In one embodiment, the mixture contains from about 0.1% to about 75% by weight of the semiconducting polymer with charge carrier-binding side groups and from about 25% to about 99.9% by weight of solvent (one or more of glycol ether esters, glycol ethers, furans, and alkyl alcohols). In another embodiment, the mixture contains from about 0.5% to about 50% by weight of the semiconducting polymer with charge carrier-binding side groups and from about 50% to about 99.5% by weight of solvent. In yet embodiment, the mixture contains from about 1% to about 25% by weight of the semiconducting polymer with charge carrier-binding side groups and from about 75% to about 99% by weight of solvent.

The semiconducting polymer with charge carrier-binding side groups can be prepared by any suitable method. In one embodiment of the subject invention, the semiconducting polymer with charge carrier-binding side groups can be formed from monomeric precursors of the semiconducting polymers containing one or more charge carrier-binding groups. The charge carrier-binding side groups can be introduced into the monomeric precursors through suitable chemical reactions well known to a person skilled in the art. For example, charge carrier-binding groups can be introduced into monomeric units by chemical reactions such as substitution, alkylation, modification, and/or addition type of reactions. In another embodiment of the subject invention, charge carrier-binding side groups can be incorporated into semiconducting polymers during the assembly/formation of a semiconducting polymer layer. In yet another embodiment of the subject invention, the charge carrier-binding groups are introduced into the semiconducting polymer after the formation of the semiconducting polymer layer.

The charge carrier-binding side groups of the subject invention can have any suitable linkage with a semiconducting polymer. For example, the charge carrier-binding side groups can be linked/attached to the semiconducting polymers through covalent bonding.

The semiconducting polymers having charge carrier-binding groups in the main chain/backbone can be prepared using any suitable synthetic method. In one embodiment of the subject invention, the semiconducting polymer having charge carrier-binding groups in its main chain/backbone can be prepared using monomeric precursors of semiconducting polymer and appropriate forms of charge carrier-binding groups. For example, monomeric precursors can be reacted with appropriate forms of charge carrier-binding groups through suitable chemical reactions well known to a person skilled in the art. For example, semiconducting polymers with charge carrier-binding groups, such as substituted and/or unsubstituted pyridine, bipyridine, terpyridine, quaterpyridine, quinquepyridine, sexipyridine, phenanthroline, ethers, thioethers, crown ethers, alkylene glycols, and derivatives thereof in the main chain/backbone can be prepared using chemical reactions such as coupling, substitution, alkylation, modification, and/or addition type of reactions.

The composition of a semiconducting polymer layer can be adjusted appropriately by varying the proportion of semiconducting polymers with and without charge carrier-binding groups such that the desirable semiconducting properties of the polymers are preserved. In one embodiment of the subject invention, all the semiconducting polymers contain charge carrier-binding groups either as side groups or in the main chain. In another embodiment of the subject invention, the semiconducting polymer layer is formed using one or more semiconducting polymers containing no charge carrier-binding groups and one or more semiconducting polymers containing charge carrier-binding groups. For example, the semiconducting polymer layer can be formed using an equal proportion of semiconducting polymers with no charge carrier-binding groups and semiconducting polymers with charge carrier-binding groups. In another example, the semiconducting polymer layer contains from about 1% to about 99.99% by weight of the semiconducting polymer with charge carrier-binding groups and from about 99% to about 0.01% by weight of the semiconducting polymer with no charge carrier-binding groups.

The number of charge carrier-binding side groups in a monomeric unit of a semiconducting polymer molecule can be varied to obtain optimal retention time while retaining the semiconducting properties of the semiconducting polymer layer. In one embodiment of the subject invention, each monomeric unit of the semiconducting polymer molecule with charge carrier-binding side groups can have one charge carrier-binding group. In another embodiment of the subject invention, each monomeric unit of a semiconducting polymer with charge carrier-binding side groups can have more than one charge carrier-binding side group. In yet another embodiment of the subject invention, the semiconducting polymer with charge carrier-binding groups can have a main chain with alternating charge carrier-binding groups and monomeric precursors. In a further embodiment of the subject invention, the frequency and/or proportion of charge carrier-binding groups occurring in the main chain of a semiconducting polymer can be varied.

The number of charge carrier-binding groups in a semiconducting polymer can be varied appropriately to adjust the distance between successive charge carrier-binding groups in a semiconducting polymer molecule. In one embodiment of the subject invention, the proportion of charge carrier-binding groups to monomeric units of a semiconducting polymer molecule ranged from about 0.01:1 to about 1:1.

For instance, in one embodiment of the subject invention, each monomeric unit of a semiconducting polymer can have one charge carrier-binding group. In another instance, every 100 monomeric units of a semiconducting polymer molecule can have one charge carrier-binding group.

The charge carrier-binding groups in a semiconducting polymer molecule with charge carrier-binding groups can be chemically the same or different. For example, a semiconducting polymer molecule with charge carrier-binding groups may contain only pyridinyl moieties as charge carrier-binding groups. In another example, a semiconducting polymer molecule with charge carrier-binding groups may have more than one type of group selected from charge carrier-binding groups such as substituted and/or unsubstituted pyridine, bipyridine, terpyridine, quaterpyridine, quinquepyridine, sexipyridine, phenanthroline, ether, crown ether, thioether, alkylene glycol, and derivatives thereof.

Referring to FIG. 3, a flow diagram of a method for improving retention time of a polymer memory cell according to one aspect of the subject invention is illustrated. For simplicity of explanation, the methodology is depicted and described as a series of acts. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art will understand and appreciate that the methodologies could alternatively be represented as a series of interrelated states via a state diagram or events.

The method 300 involves forming a first electrode layer on a substrate (act 302), forming a passive layer adjacent to the first electrode (act 304), forming a semiconducting polymer layer with at least one semiconducting polymer having one or more charge carrier-binding groups (act 306), and forming a second electrode over the semiconducting polymer layer (act 308).

Figure 4:
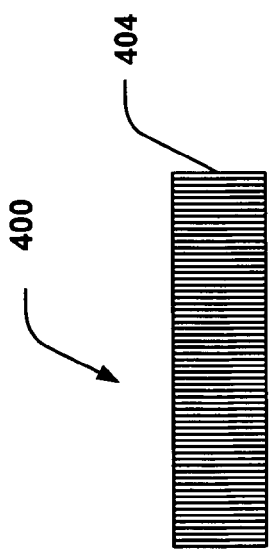

FIGS. 4–8 illustrate a polymer memory cell in various states of manufacture in accordance with the methodology described in FIG. 3. FIG. 4 is a cross-sectional illustration of a polymer memory cell 400 on a substrate 404 utilized to perform the methodology described in FIG. 3. The substrate 404 can be any substrate used in the course of semiconductor processing or any semiconductor surfaces. The substrate 404 is formed using methods known to one skilled in the art. Typically, the substrate 404 is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

Figure 5:
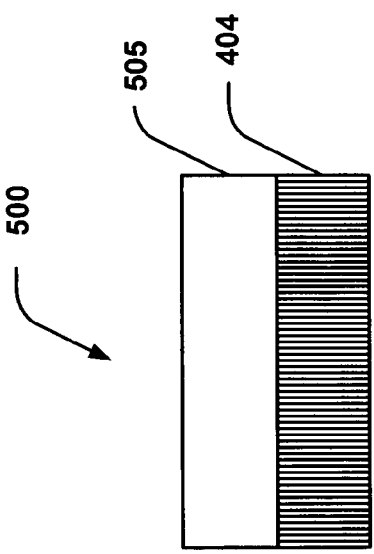

Referring to FIG. 3, act 302 of the method 300 is forming a first electrode on the substrate 404. FIG. 5 is a cross-sectional illustration of a polymer memory cell 500 showing the first electrode 505 over the substrate 404. The first electrode 505 is formed using methods known to one skilled in the art. For example, the first electrode 505 is formed by depositing metals using techniques such as etching, evaporation, physical vapor deposition (PVD), chemical vapor deposition (CVD) and plasma enhanced chemical vapor deposition (PECVD).

The first electrode 505 may or may not cover the entire surface of the substrate 404. The first electrode 505 is made of conductive material; such as a conductive metal, conductive metal alloys, conductive metal oxides, conductive polymer films, semiconductive materials, and the like. Specific examples of materials for the first electrode 505 include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

The thickness and width of the first electrode 505 may depend upon the specific lithography and design rules. In one embodiment, the thickness of the first electrode 505 is about 0.01 µm or more and about 10 µm or less. In another embodiment, the thickness of the first electrode 505 is about 0.05 µm or more and about 5 µm or less. In yet another embodiment, the thickness of the first electrode 505 is about 0.1 µm or more and about 1 µm or less.

The position of the first electrode 505 is not critical for the subject invention and one skilled in the art would recognize that the first electrode can be placed in a variety of positions without losing the advantages of the subject invention.

Figure 6:
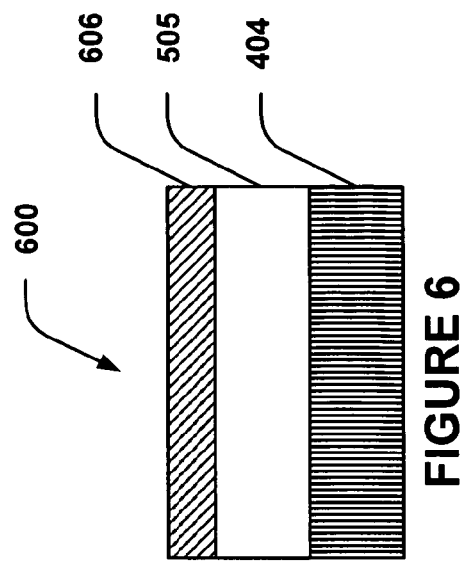
FIGS. 4–8 illustrate cross-sectional views of a polymer memory cell in various states of manufacture in accordance with the methodology described in FIG. 3.

Referring to FIG. 3, act 304 of the method 300 is forming of a passive layer. FIG. 6 is a cross-sectional illustration of a polymer memory cell 600 showing the substrate 404, the first electrode 505 and a passive layer 606. The passive layer 606 is formed adjacent to the first electrode 505. The passive layer 606 can be made of at least one conductivity facilitating compound. Examples of conductivity facilitating compounds that may constitute the passive layer 606 include one or more of copper sulfide ($Cu_2S$, CuS), copper rich copper sulfide ($Cu_3S$, CuS; $Cu_3S$, $Cu_2S$), copper oxide (CuO, $Cu_2O$), copper selenide ($Cu_2Se$, CuSe), copper telluride ($Cu_2Te$, CuTe), manganese oxide ($MnO_2$), titanium dioxide ($TiO_2$), indium oxide ($I_3O_4$), silver sulfide ($Ag_2S$, AgS), gold sulfide ($Au_2S$, AuS), iron oxide ($Fe_3O_4$), cobalt arsenide ($CoAs_2$), nickel arsenide (NiAs), and the like. The conductivity facilitating compounds do not necessarily dissociate into ions under the strength of the electric field, although ions may move through them. The passive layer 606 may contain two or more subpassive layers, each sublayer containing the same, different, or multiple conductivity facilitating compounds.

The passive layer 606 is grown using oxidation techniques, formed via gas phase reactions, implantation techniques, or deposited on/between electrodes. In some instances, the passive layer 606 may be treated with a plasma after it is formed. The plasma treatment modifies the energy barrier of the passive layer 606.

Figure 7:
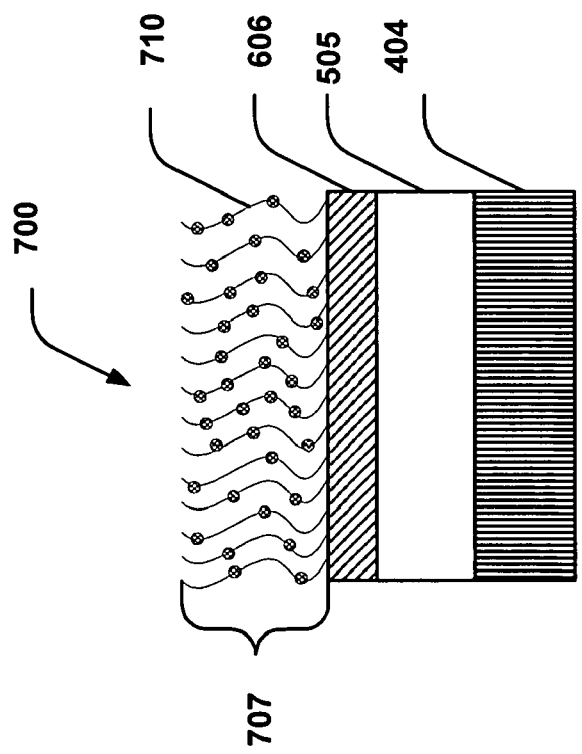

Referring back to FIG. 3, act 306 of method 300 is forming a semiconducting polymer layer with at least one semiconducting polymer layer containing charge carrier-binding groups. FIG. 7 is a cross-sectional illustration of a polymer memory cell 500 undergoing act 106, showing the substrate 404, the first electrode layer 505, the passive layer 606, and a semiconducting polymer layer 707 containing one or more semiconducting polymers. The semiconducting polymer layer 707 of the subject invention contains at least one semiconducting polymer 710 with one or more charge carrier-binding groups as described earlier. For simplicity purposes, the semiconducting polymer is depicted in drawings as having charge carrier-binding groups in the main chain. However, it is to be noted that the charge carrier-binding groups can be present either as side chain groups or as part of the main chain of a semiconducting polymer. Examples of semiconducting polymers that can be used to form semiconducting polymer layer 707 include conjugated organic polymers, organometallic polymers.

The organic polymer typically contains a conjugated organic polymer. The polymer backbone of the conjugated organic polymer extends lengthwise between the electrodes. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the semiconducting polymer, such as a conjugated organic polymer, has the ability to donate and accept charges (holes and/or electrons). Generally, the semiconducting polymer or an atom/moiety in the polymer has at least two relatively stable states. The two relatively stable oxidation states permit the semiconducting polymer to donate and accept charges and electrically interact with the conductivity facilitating compound. The ability of the semiconducting polymer layer to donate and accept charges and electrically interact with the passive layer also depends on the identity of the conductivity facilitating compound.

The organic polymers (or the organic monomers constituting the organic polymers) may be cyclic or acyclic. During formation or deposition, the organic polymer self assembles between the electrodes. Examples of conjugated organic polymers include one or more of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polyfluorene; polyphenylene and alkyl- or alkoxy-substituted derivates thereof; polythiophene and alkyl- or alkoxy-substituted derivates thereof; polypyrrole; polysilane; polystyrene; polyfuran; polyindole; polyazulene; polyphenylene; polyfluorenes, polypyridine; polybipyridine; polyphthalocyanine; polysexithiophene; poly(silicon-oxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like. Examples further include any co-polymers, ter-polymers, etc. that contain repeating units of any of the above-mentioned polymers combined with units that are not listed herein.

The semiconducting polymer 710 of act 306 can be formed by spin-on techniques (depositing a mixture of the polymer/polymer precursor and a solvent, then removing the solvent from the substrate/electrode), as described earlier herein. During formation or deposition, the polymer material may self assemble between electrode layers.

The semiconducting polymer layer 707 can be of any suitable thickness. In one embodiment, the semiconducting polymer layer 707 has a thickness of about 0.001 μm or more and about 5 μm or less. In another embodiment, the semiconducting polymer layer 707 has a thickness of about 0.01 μm or more and about 2.5 μm or less. In yet another embodiment, the semiconducting polymer layer 707 has a thickness of about 0.05 μm or more and about 1 μm or less.

Figure 8:
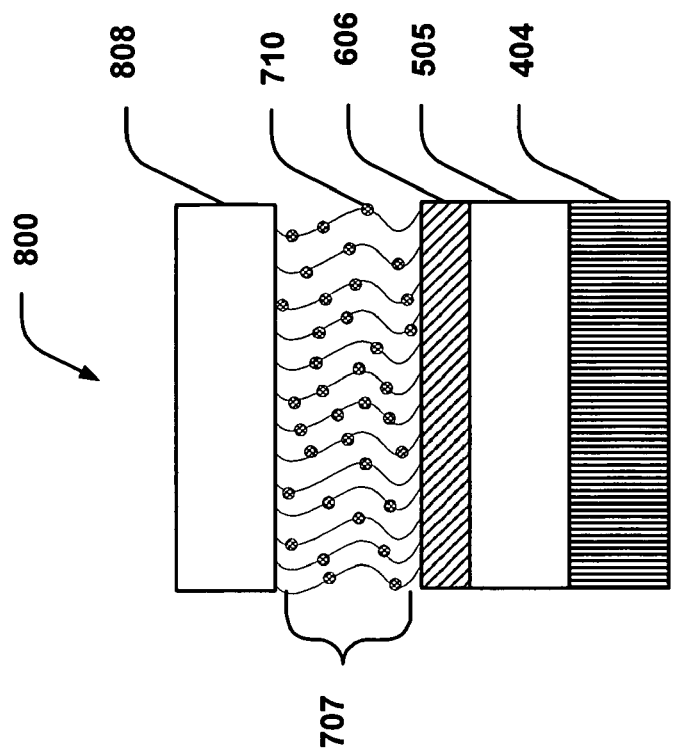

Referring to FIG. 3, act 308 of the method 300 is forming a second electrode. FIG. 8 is a cross-sectional illustration of a polymer cell 800 undergoing the formation of the second electrode 808. The second electrode 808 is formed overlying the semiconducting polymer layer 707. The second electrode 808 may be formed in a similar way as that of the first electrode 505, or in a manner different from that of the first electrode 505. In one embodiment, the second electrode 808 includes copper and/or copper containing compounds. In another embodiment, the second electrode may not contain copper and/or copper containing compounds.

After the formation of the second electrode 808, further processing may be carried out on polymer cell/device 808 to achieve a desired pattern and interconnects using techniques well known to a person skilled in the art.

The passive layer 606 may in some instances act as a catalyst when forming the semiconducting polymer layer, particularly when the semiconducting polymer layer 707 contains a conjugated organic polymer. In this connection, the polymer backbone of the conjugated organic polymer may initially form adjacent to the passive layer (on the side opposite the copper containing electrode), and grow or assemble away substantially perpendicular to the passive layer surface.

A covalent bond may be formed between the semiconducting polymer material 707 and the passive layer 606. Alternatively, a close contact is required to provide good charge carrier/electron exchange between the semiconducting polymer layer 707 and the passive layer 606. The semiconducting polymer layer 707 and the passive layer 606 are electrically coupled in that charge carrier/electron exchange occurs between the two layers. Optionally, before forming the passive layer 606, the first electrode 505 may be treated to improve the contact between the passive layer 606 and the first electrode 505.

The method 300 is described only as an exemplary embodiment, and it should be noted that a person skilled in the art would appreciate that the advantages of the subject invention can be achieved by modifying and changing the way that method 300 is carried out. For example, it is possible to use more than two electrodes and still maintain the advantages of the subject invention. Similarly, the number and placement of passive layers, semiconducting polymer layers, electrodes, and substrate can be modified while maintaining the advantages of the subject invention.

Figure 9:
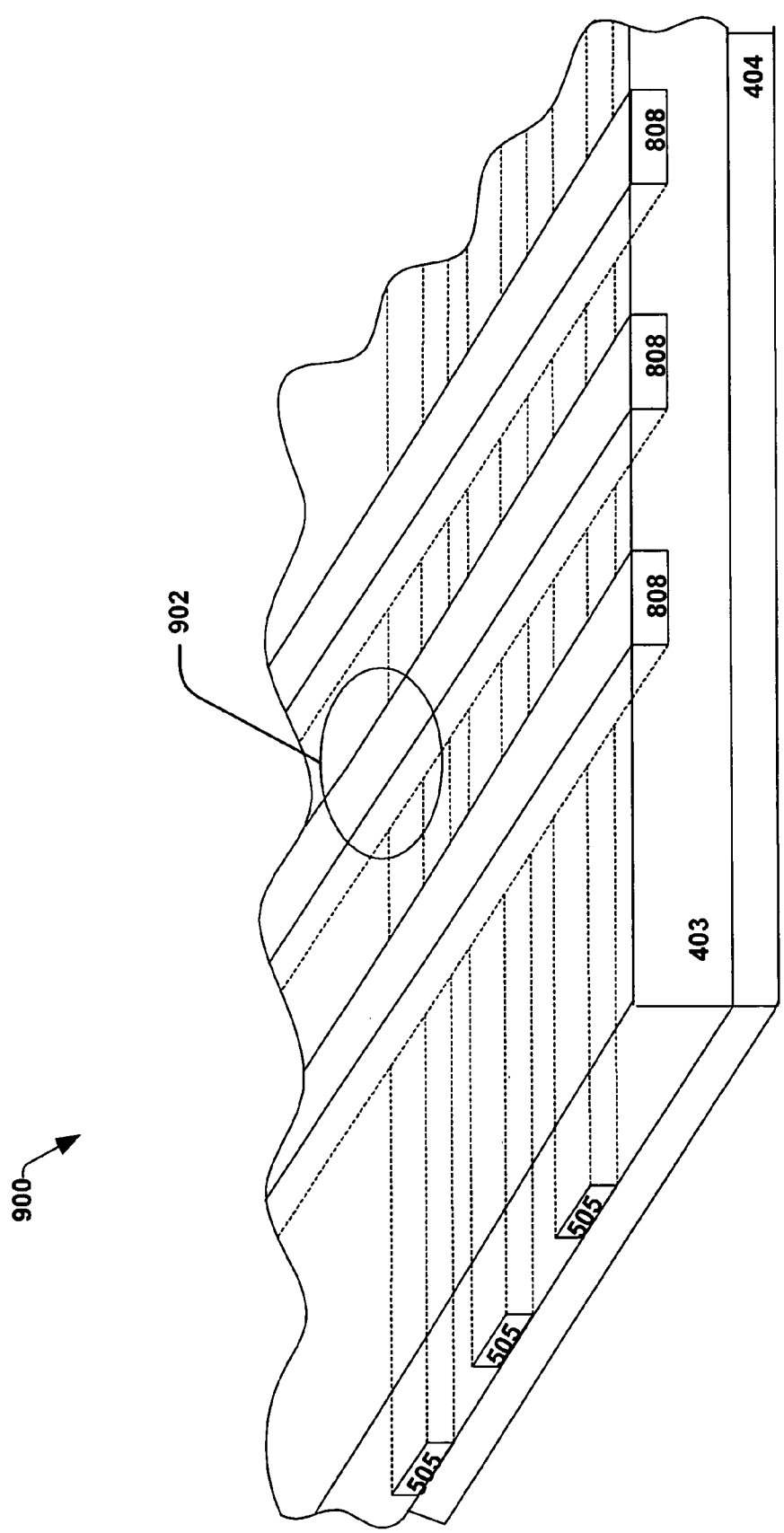
FIG. 9 illustrates an exemplary polymer memory device formed in accordance with one aspect of the subject invention.
Figure 10:
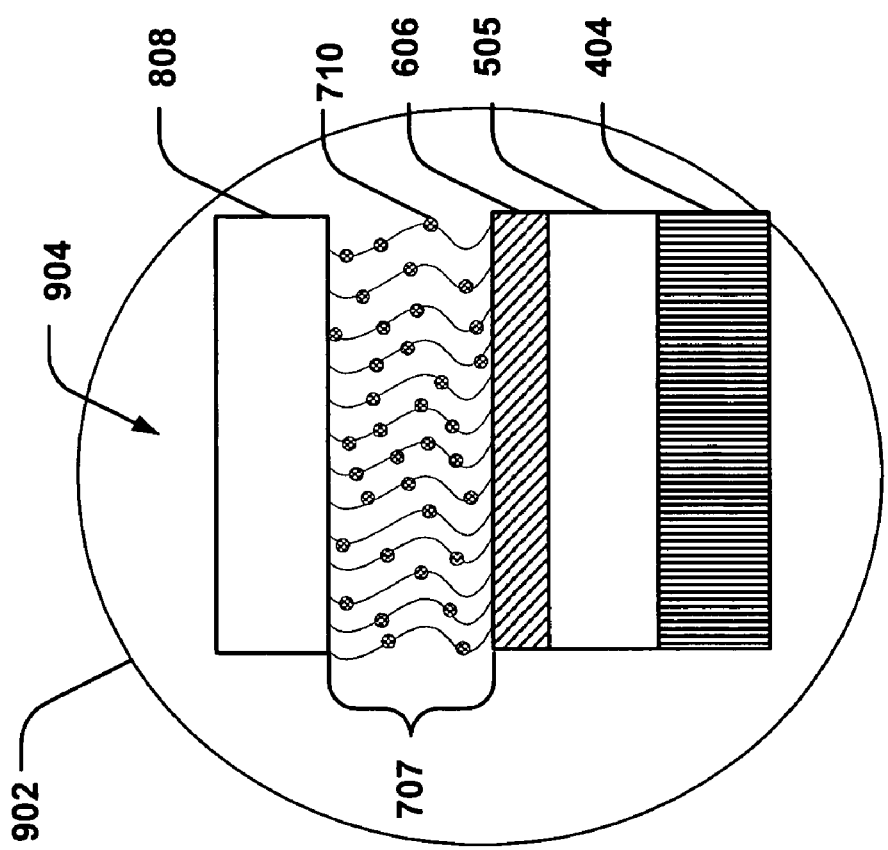
FIG. 10 illustrates an exploded cross-sectional view of an exemplary polymer memory cell as depicted in FIG. 9.

Referring to FIG. 9, a brief description of a microelectronic polymer memory device 900 containing a plurality of polymer memory cells positioned on or over a substrate 404 in accordance with one aspect of the invention is shown. The microelectronic polymer memory device 900 contains a desired number of polymer memory cells, as determined by the number of rows, columns, and layers (three dimensional orientation described later) positioned on a substrate 404. The polymer memory cells are formed in a dielectric 403. The first electrode 505 and the second electrode 808 are shown in substantially perpendicular orientation, although other orientations are possible to achieve the structure of the exploded view 902. The exploded view 902 of a polymer memory cell 904 is shown in FIG. 10 and contains a substrate 404, a first electrode 505, a passive layer 606, and a second electrode 808 with a semiconducting polymer layer 707 therebetween. The semiconducting polymer layer 707 contains at least one semiconducting polymer 710 with at least one charge carrier-binding group 512. Peripheral circuitry and devices are not shown for brevity.

The substrate 404, the passive layer 606, the electrodes 505 and 808, the semiconducting polymer layer 707 containing polymer with charge carrier-binding groups have been described earlier and all the methods and materials described before can be used to manufacture device 700. The dielectric 403 is formed by techniques known to one skilled in the art. Any suitable dielectric can be used as dielectric 403. Both inorganic and organic dielectrics can be used.

The semiconducting polymer layer 707 along with the passive layer 606 comprises the controllably conductive media. The controllably conductive media can be rendered conductive or non-conductive in a controllable manner using external stimuli. Generally, in the absence of an external stimulus, the controllably conductive media is non-conductive or has high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

Switching the polymer memory cell to the "on" state from the "off" state occurs when an external stimuli such as an applied electric field exceeds a threshold value. Switching the polymer memory cell to the "off" state from the "on" state occurs when an external stimulus exceeds a threshold value of the opposite polarity. The threshold value varies depending upon a number of factors including the identity of the materials that constitute the organic memory cell and the passive layer, the thickness of the various layers, and the like.

Generally speaking, the presence of an external stimuli such as an applied electric field that exceeds a threshold value ("programming" state) permits an applied voltage to write or erase information into/from the organic memory cell and the presence of an external stimuli such as an applied electric field that is less than a threshold value permits an applied voltage to read information from the polymer memory cell; whereas external stimuli that do not exceed a threshold value do not write or erase information into/from the organic memory cell.

To write information into the polymer memory cell, a voltage or pulse signal that exceeds the threshold is applied. To read information written into the polymer memory cell, a voltage or electric field of any polarity is applied. Measuring the impedance determines whether the organic memory cell is in a low impedance state or a high impedance state (and thus whether it is "on" or "off"). To erase information written into the polymer memory cell, a negative voltage opposite in polarity to the writing signal, that exceeds a threshold value, is applied.

The conductivity facilitating compound of the passive layer 606 contributes to the controllably conductive properties of the controllably conductive media. The conductivity facilitating compound has the ability to donate and accept charges (holes and/or electrons) and/or act as a source of copper ions. The passive layer 606 thus may transport holes, electrons, and/or ions between an electrode and the semiconducting polymer layer/passive layer interface, facilitate charge/carrier injection into the organic semiconducting polymer layer, and/or increase the concentration of a charge carrier (ions, holes and/or electrons) in the semiconducting polymer layer 707. In some instances, the passive layer 707 may store opposite charges thereby providing a balance of charges in the organic memory device as a whole. Storing charges/charge carriers is facilitated by the existence of two relatively stable oxidation states for the conductivity facilitating compound. The subject invention advantageously improves the duration the charge carriers stay in a semiconducting polymer layer.

The fermi level of the passive layer 606 is close to the valence band of the semiconducting polymer layer 707. Consequently, the injected charge carrier (into the semiconducting polymer layer 707) may recombine with the charge at the passive layer 606 if the energy band of the charged semiconducting polymer layer 707 does not substantially change. Positioning energy bands involves compromising between each of charge injection and length of charge (data) retention time.

Figure 11:
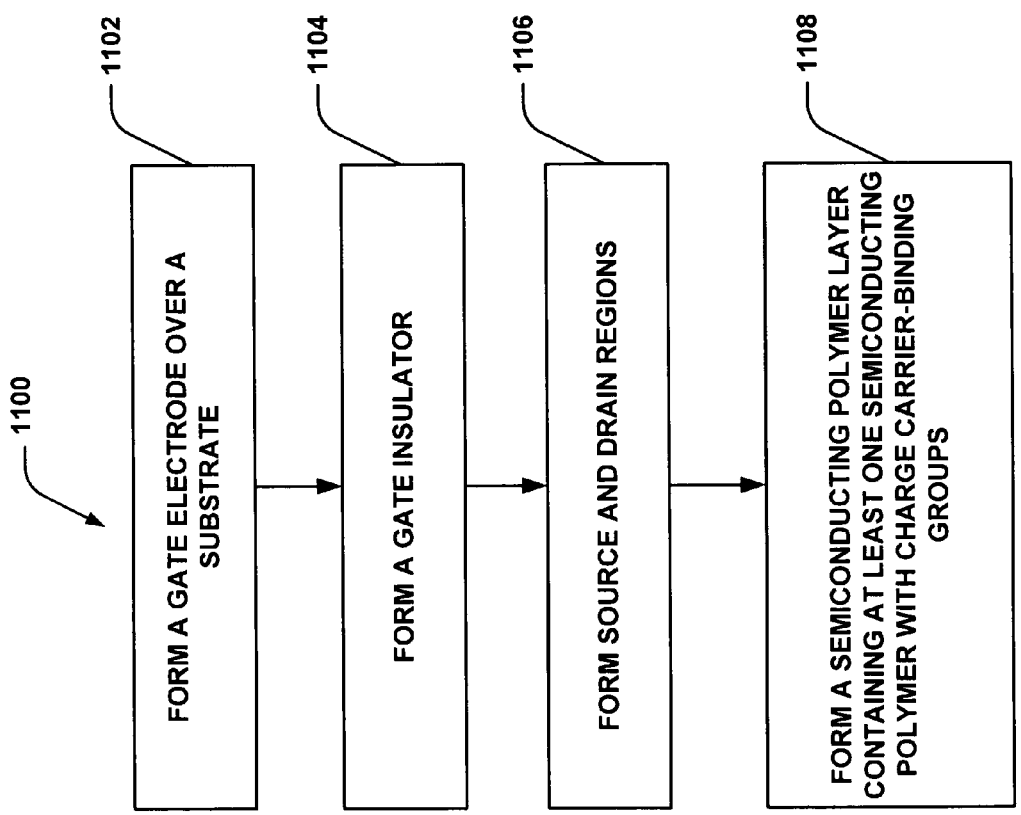
FIG. 11 illustrates a flow diagram of an exemplary methodology for fabricating an organic transistor according to one aspect of the subject invention.

According to yet another aspect of the subject invention, a method is provided to improve at least one of carrier ion/charge mobility, distribution and permeability in a semiconducting polymer layer of an organic thin film transistor. FIG. 11 depicts a flow chart of an exemplary method 1100 for improving at least one of carrier ion/charge mobility, distribution, and permeability in a semiconducting polymer layer of an organic thin film transistor. The method 1100 involves forming a gate electrode (act 1102), forming an insulator (act 1104), forming source and drain regions (act 1106), and forming a semiconducting polymer layer containing at least one semiconducting polymer with charge carrier-binding groups (act 1108).

For simplicity of explanation, the methodologies are depicted and described as a series of acts. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art will understand and appreciate that the methodologies could alternatively be represented as a series of interrelated states via a state diagram or events.

Figure 12:
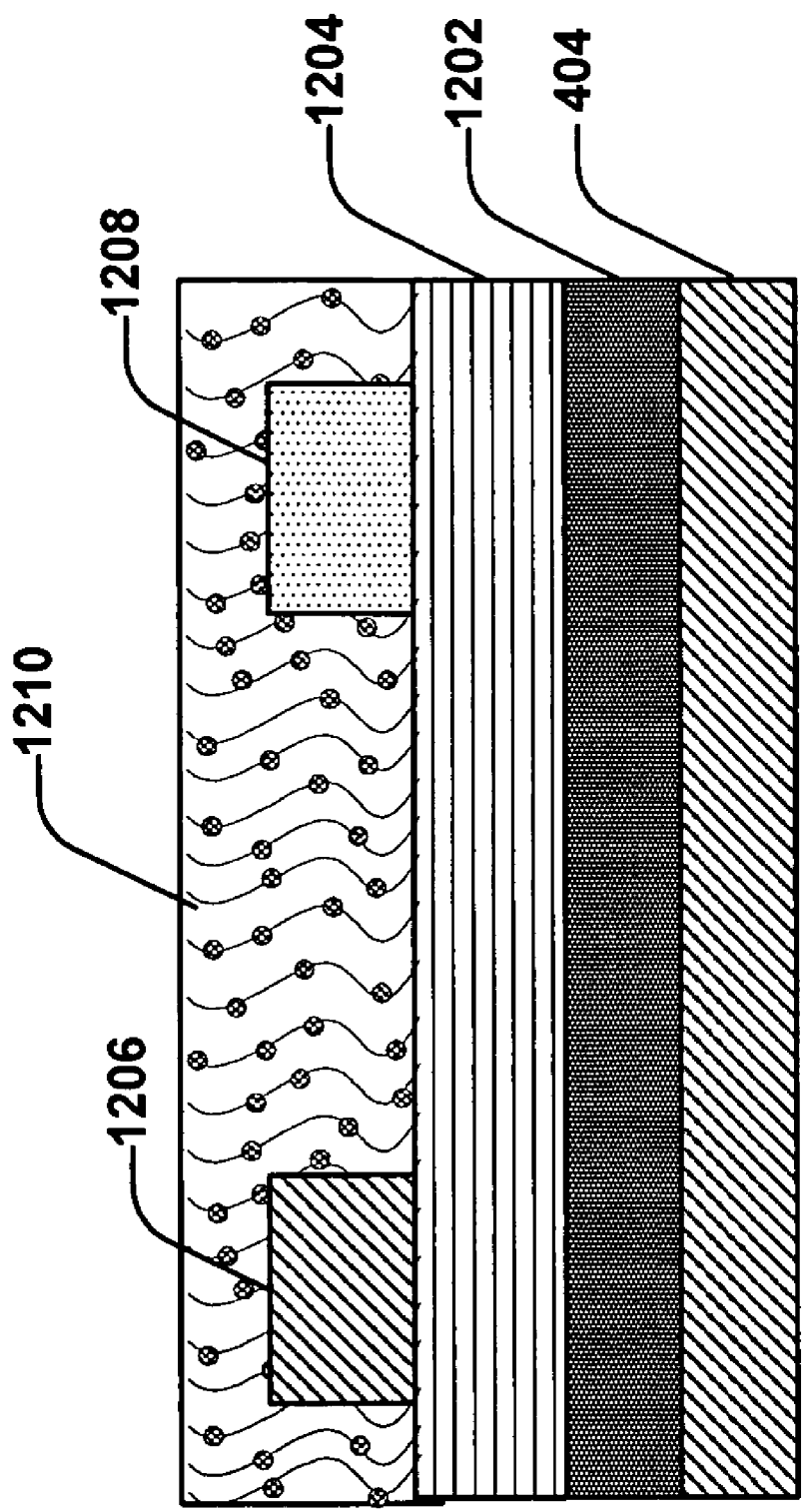
FIG. 12 illustrates a cross-sectional view of an organic transistor fabricated following the methodology described in FIG. 11.

FIG. 12 is a cross sectional illustration of an organic thin film transistor undergoing fabrication according to method 1100. FIG. 12 shows a substrate 404, a gate electrode 1202, a gate insulator 1204, a source region 1206, a drain region 1208, a semiconducting polymer layer 1210. In one embodiment of the subject invention, act 1102 is forming gate electrode 1202 on a substrate 404. The substrate 404 is described before and all the methods and materials described before can be applied here. Optionally, the substrate 404 may be a flexible substrate such as plastic or glass.

The gate electrode 1202 is deposited onto the substrate 404. Any suitable material can be used to form the gate electrode. Examples of materials that can be used to form a gate electrode include conductive materials such as metals, metal alloys, and metal compounds. General examples include aluminum, silicon, molybdenum, zirconium, niobium, copper, tungsten, bismuth, nickel, tantalum, titanium, and compounds and alloys thereof. The methods to form the gate electrode 1202 are well known, and are similar to the ones described earlier during description of the electrode 505 of method 300.

Act 1104 is forming a gate insulator layer 1204 adjacent to the gate electrode 3002. In one embodiment of the subject invention, the gate insulator 1204 is formed by anodization of the gate electrode 1202. Gate electrode materials that can be anodized include Si, Al, Ti, Zr, Hf, V, Nb, Ta, Mo, W, and alloys comprised primarily of these elements. The methods to form insulating layer 1204 over at least a portion of gate electrode are well known to persons skilled in the art.

Act 1106 of method 1100 is fabrication of source and drain regions. An electrically conducting source region 1206 and a drain region 1208 are formed over the gate insulator 1204. The source and drain regions may be spaced apart. Any suitable material can be used to form the source region 1206 and the drain region 1208. In one embodiment of the subject invention, the source region 1206 and the drain region 1208 are formed using Ag. Standard lithographic techniques known to a person skilled in the art may be used to pattern the source 1206 and the drain 1208 regions.

Act 1108 of method 1100 is formation of a semiconductor polymer layer 1210 contacting at least a portion of the gate electrode 1202, the source 1206, and the drain 1208. The semiconductor polymer layer 1210 contains at least one semiconducting polymer with one or more charge carrier-binding groups. The materials and methods to form the semiconductor polymer layer 1210 are similar to the forming of the semiconductor polymer layer 707 and therefore, are not described here. Any semiconducting polymer with charge carrier-binding groups described earlier can be used to form the semiconducting polymer layer 1210.

Although method 1100 is described using one exemplary configuration for making an organic transistor, a person skilled in the art would appreciate that it is within the scope of the subject invention to fabricate organic transistors with different configurations without deviating from the scope of the subject invention. For example, a person skilled in the art would be able to change the positions of the source region, drain region, gate region, insulating layer, and semiconducting polymer layer without losing the advantages of the subject invention.

The methods and systems of improving memory retention time described in the subject invention are useful for any device employing polymer semiconductors. For example, the semiconducting polymer devices with improved memory retention times are useful in computers, appliances, industrial equipment, hand-held devices, telecommunications equipment, medical equipment, research and development equipment, transportation vehicles, radar/satellite devices, and the like. Examples of hand-held devices include cell phones, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for improving memory retention time of a polymer memory cell, comprising:
forming a semiconducting polymer layer over a passive layer using a spin-on mixture comprising from about 0.1% to about 75% by weight of at least one semiconducting polymer with charge carrier-binding groups and from about 25% to about 99.9% by weight of one or more solvents selected from the group of glycol ether esters, glycol ethers, furans, aromatic hydrocarbons, and alkyl alcohols containing from about 4 to about 7 carbon atoms, the semiconducting polymer layer comprises at least one semiconducting polymer with one or more charge carrier-binding groups that reversibly bind charge carriers.

2. The method of claim 1, wherein the charge carriers comprise at least one copper ions, electrons, and holes.

3. The method of claim 1, wherein the semiconducting polymer with the charge carrier-binding groups has the charge carrier-binding groups in main chain of the semiconducting polymer.

4. The method of claim 1, wherein the semiconducting polymer with the charge carrier-binding groups has the charge carrier-binding groups as side chain groups of the semiconducting polymer.

5. The method of claim 1, wherein the charge carrier-binding groups comprise at least one selected from the group consisting of crown ethers and alkylene glycols.

6. The method of claim 1, wherein the semiconducting polymer containing charge carrier-binding groups has more than one type of charge carrier-binding groups.

7. The method of claim 1, wherein the semiconducting polymer layer comprises from about 1% to about 99.99% by weight of the semiconducting polymer with charge carrier-binding groups and from about 99% to about 0.01% by weight of the semiconducting polymer with no charge carrier groups.

8. The method of claim 1, wherein the charge carrier-binding groups are linked to the semiconducting polymer via covalent linkage.

9. The method of claim 1, wherein each monomeric precursor has one or more charge carrier-binding side groups.

10. The method of claim 1, wherein the proportion of charge carrier-binding groups to a monomeric precursor of the semiconducting polymer ranges from about 0.01:1 to about 1:1.

11. A method of fabricating an organic thin film transistor, comprising:
depositing a gate electrode;
forming an insulator adjacent to the gate electrode;
forming source and drain regions; and
forming a semiconducting polymer layer using a spin-on mixture comprising from about 0.1% to about 75% by weight of at least one semiconducting polymer with charge carrier-binding groups and from about 25% to about 99.9% by weight of one or more solvents selected from the group of glycol ether esters, glycol ethers, furans, aromatic hydrocarbons, and alkyl alcohols containing from about 4 to about 7 carbon atoms, wherein the semiconducting polymer layer comprises at least one semiconducting polymer with one or more charge carrier-binding groups.

12. The method of claim 11, wherein the charge carrier-binding groups comprise at least one of crown ethers and alkylene glycols.

13. The method of claim 11, wherein the charge carrier-binding groups are incorporated into a main polymer chain of the semiconducting polymer.

14. The method of claim 11, wherein the charge carriers-binding groups are incorporated as side groups of the semiconducting polymer.

15. The method of claim 11, wherein the semiconducting polymer layer comprises from about 1% to about 99.99% by weight of the semiconducting polymer with charge carrier-binding groups and from about 99% to about 0.01% by weight of the semiconducting polymer with no charge carrier-binding groups.

16. A method for improving memory retention of a polymer memory cell comprising:
providing a first electrode on a substrate and forming a passive layer over the first electrode;
forming a semiconducting polymer layer over the passive layer using a spin-on mixture comprising from about 0.1% to about 75% by weight of at least one semiconducting polymer with charge carrier-binding groups and from about 25% to about 99.9% by weight of one or more solvents selected from the group of glycol ether esters, glycol ethers, furans, aromatic hydrocarbons, and alkyl alcohols containing from about 4 to about 7 carbon atoms, the semiconducting polymer layer comprising at least one semiconducting polymer with one or more charge carrier-binding groups; and
providing a second electrode over the semiconducting polymer layer.

17. A method for improving memory retention time of a polymer memory cell, comprising:
forming a semiconducting polymer layer over a passive layer using a spin-on mixture comprising from about 0.5% to about 50% by weight of at least one semiconducting polymer with charge carrier-binding groups and from about 50% to about 99.5% by weight of one or more solvents selected from the group of glycol ether esters, glycol ethers, furans, aromatic hydrocarbons, and alkyl alcohols containing from about 4 to about 7 carbon atoms, the semiconducting polymer layer comprises at least one semiconducting polymer with one or more charge carrier-binding groups that reversibly bind charge carriers.

18. The method of claim 17, wherein the semiconducting polymer with the charge carrier-binding groups has the charge carrier-binding groups in main chain of the semiconducting polymer.

19. The method of claim 17, wherein the semiconducting polymer layer comprises from about 1% to about 99.99% by weight of the semiconducting polymer with charge carrier-binding groups and from about 99% to about 0.01% by weight of the semiconducting polymer with no charge carrier groups.

20. The method of claim 17, wherein the proportion of charge carrier-binding groups to a monomeric precursor of the semiconducting polymer ranges from about 0.01:1 to about 1:1.

* * * * *